United States Patent
Cadag et al.

(10) Patent No.: US 10,128,169 B1
(45) Date of Patent: Nov. 13, 2018

(54) PACKAGE WITH BACKSIDE PROTECTIVE LAYER DURING MOLDING TO PREVENT MOLD FLASHING FAILURE

(71) Applicant: STMicroelectronics, Inc., Calamba (PH)

(72) Inventors: Aaron Cadag, Calamba (PH); Ian Harvey Arellano, Bauang (PH); Ela Mia Cadag, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 0 days.

(21) Appl. No.: 15/594,351

(22) Filed: May 12, 2017

(51) Int. Cl.
*H01L 21/44* (2006.01)
*H01L 23/495* (2006.01)
*H01L 23/00* (2006.01)
*H01L 23/31* (2006.01)
*H01L 21/683* (2006.01)
(Continued)

(52) U.S. Cl.
CPC ...... *H01L 23/49513* (2013.01); *H01L 21/565* (2013.01); *H01L 21/568* (2013.01); *H01L 21/6836* (2013.01); *H01L 21/78* (2013.01); *H01L 23/315* (2013.01); *H01L 23/3114* (2013.01); *H01L 23/4952* (2013.01); *H01L 23/49541* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 24/97* (2013.01); *H01L 2221/68381* (2013.01); *H01L 2224/32245* (2013.01); *H01L 2224/48091* (2013.01); *H01L 2224/48106* (2013.01); *H01L 2224/48247* (2013.01); *H01L 2224/73265* (2013.01); *H01L 2224/83005* (2013.01); *H01L 2224/92247* (2013.01)

(58) Field of Classification Search
CPC . H01L 21/565; H01L 21/568; H01L 21/6836; H01L 23/49513
USPC .......................................... 438/126, 112, 118
See application file for complete search history.

(56) References Cited

U.S. PATENT DOCUMENTS 5,976,912 A * 11/1999 Fukutomi ........... H01L 21/4803
257/E21.502
6,294,100 B1 * 9/2001 Fan ..................... H01L 21/4832
216/14
(Continued)

OTHER PUBLICATIONS

Kuraray Co., Ltd., "Isobam: Water Soluble Polymer," Product Brochure, May 1997, 16 pages.

*Primary Examiner* — Nitin Parekh
(74) *Attorney, Agent, or Firm* — Seed IP Law Group LLP

(57) ABSTRACT

A semiconductor package formed utilizing a removable backside protective layer includes a leadframe, a die pad, leads and a molding compound around them. The first surface of the die pad and leads are exposed to an external environment by the plurality of recesses. The recesses are formed by coupling a removable backside protective layer to the leadframe before applying the molding compound. After the molding compound is applied and cured, the backside protective layer is removed to expose the first surface of the die pad and the first surfaces of the leads so the semiconductor package may be mounted within an electronic device. The removable backside protective layer protects the die pad and the leads from mold flashing and residue when forming the semiconductor package during the fabrication process.

16 Claims, 11 Drawing Sheets

(51) Int. Cl.
*H01L 21/56* (2006.01)
*H01L 21/78* (2006.01)

(56) References Cited

U.S. PATENT DOCUMENTS

| | | | | |
|---|---|---|---|---|
| 7,732,259 | B2* | 6/2010 | Low | H01L 24/97 |
| | | | | 257/66 |
| 8,089,159 | B1* | 1/2012 | Park | H01L 21/4832 |
| | | | | 257/773 |
| 2004/0017668 | A1* | 1/2004 | Siegel | H01L 21/566 |
| | | | | 361/760 |
| 2004/0110319 | A1* | 6/2004 | Fukutomi | H01L 21/4803 |
| | | | | 438/106 |
| 2010/0314731 | A1* | 12/2010 | Camacho | H01L 21/565 |
| | | | | 257/676 |

\* cited by examiner

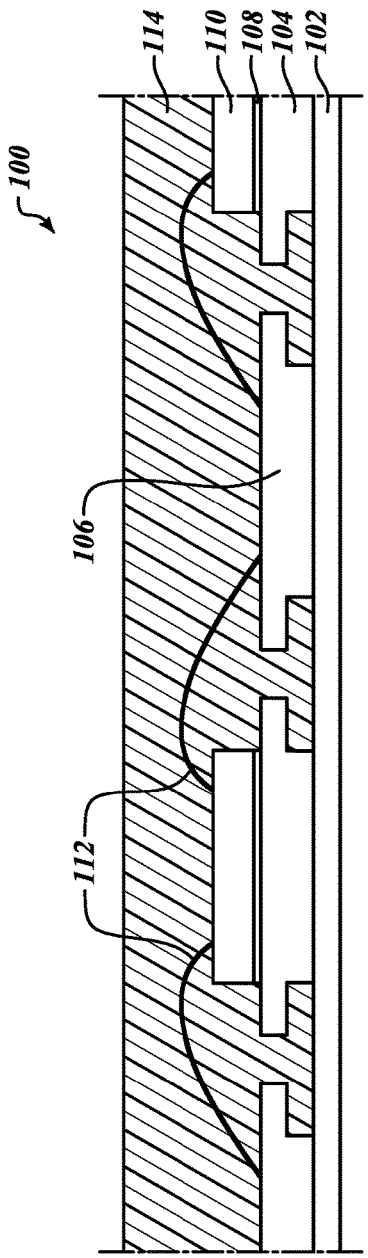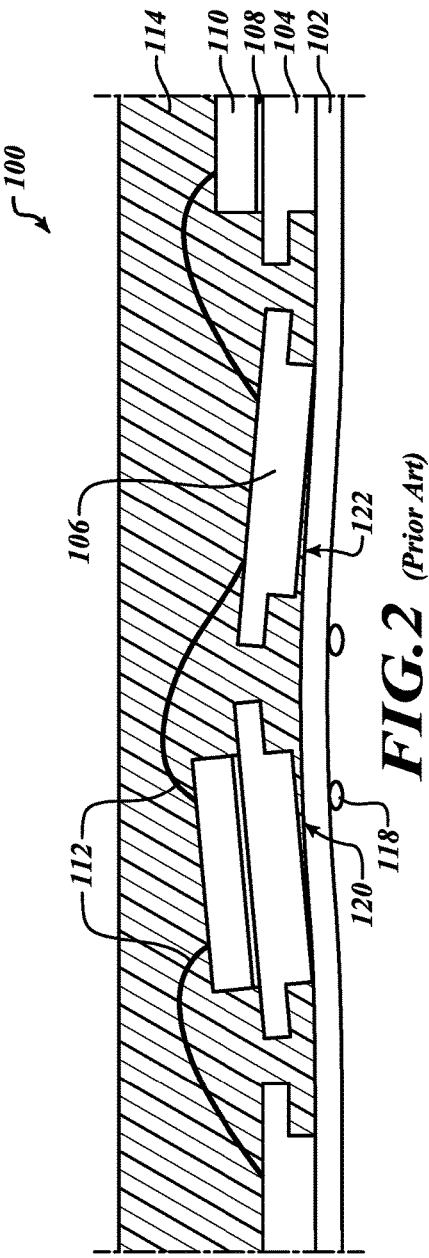

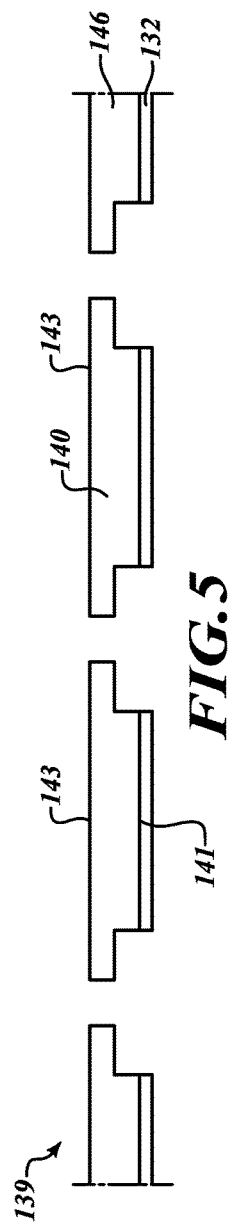
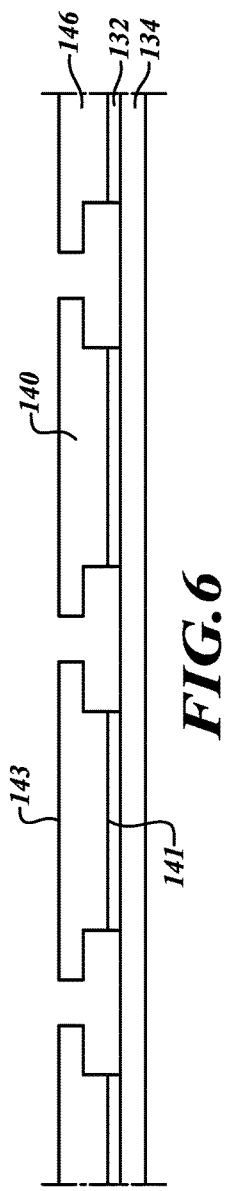
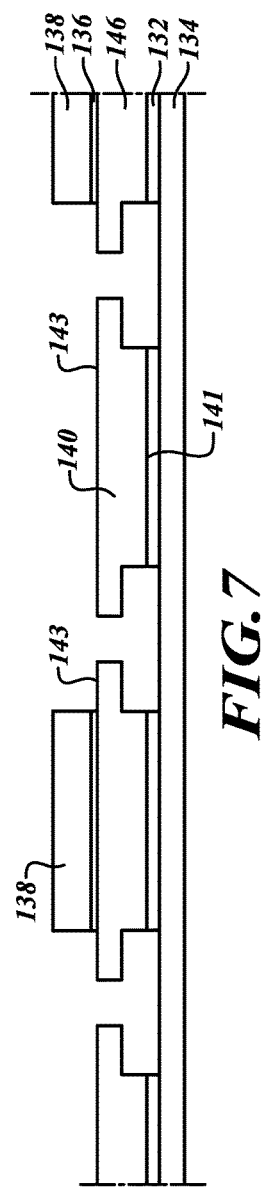

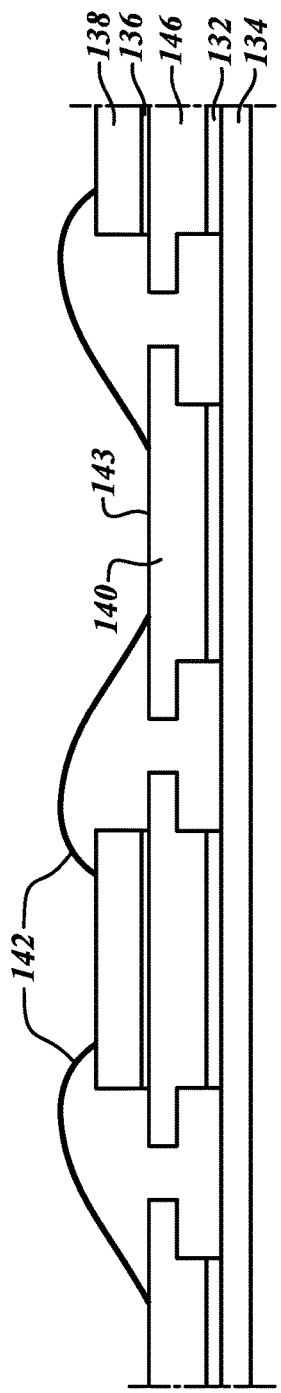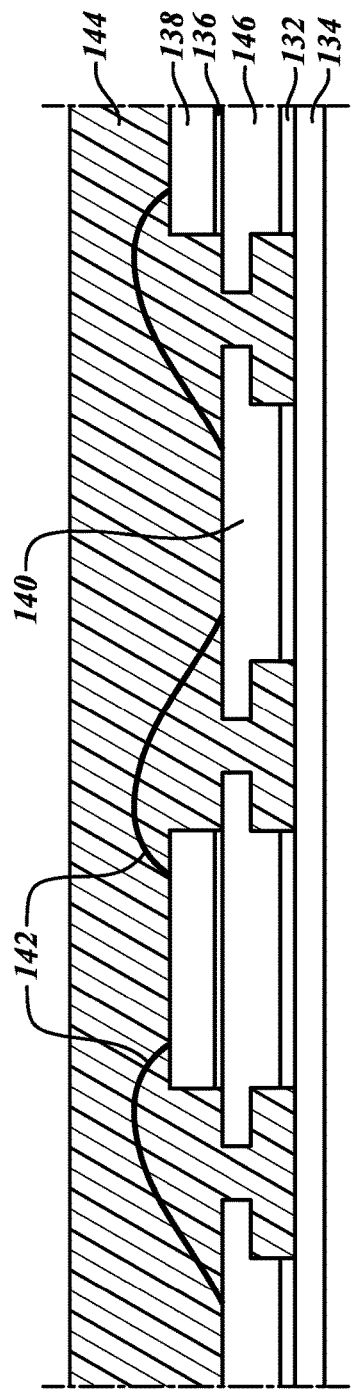

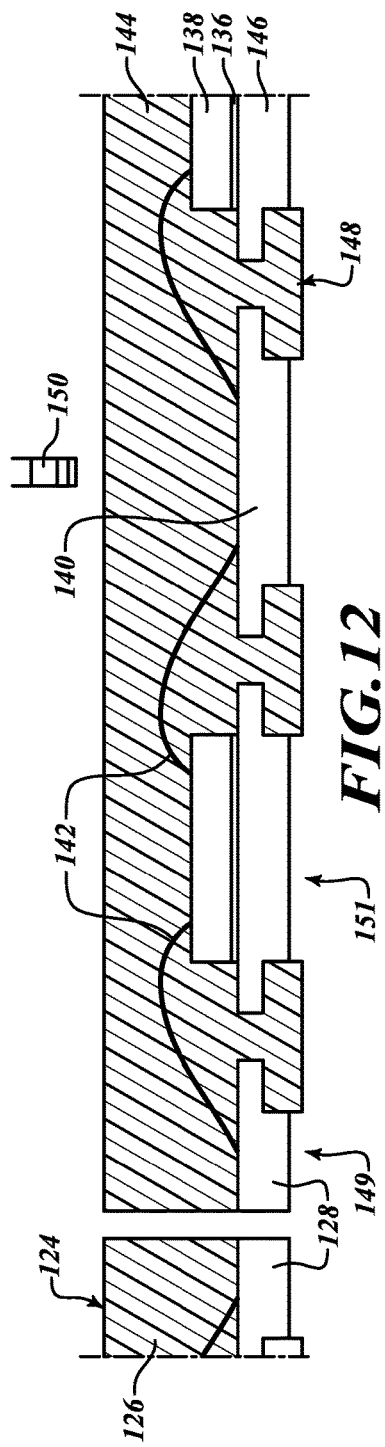
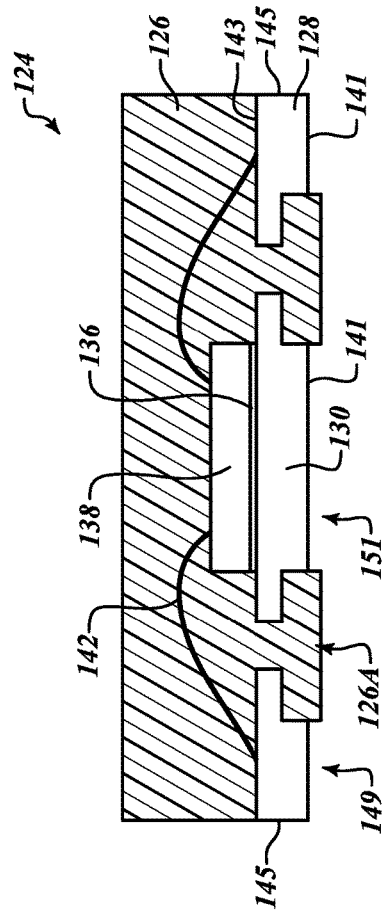

PACKAGE WITH BACKSIDE PROTECTIVE LAYER DURING MOLDING TO PREVENT MOLD FLASHING FAILURE

BACKGROUND

Technical Field

The present disclosure is directed to a package having a removable protective layer attached to the leadframe during molding to prevent mold flashing from forming on the leads.

Description of the Related Art

As consumer demand increases for semiconductor packages, manufacturers face significant challenges to manufacture and form packages by the thousands with zero to minimal defects. Additionally, as semiconductor packages are mounted within an electronic device, manufacturers face significant challenges to avoid mounting defects that may cause short circuiting of semiconductor packages, effectively reducing their life span or making them defective. Semiconductor packages often include a die, a leadframe, and a molding compound. For example, the leadframe is mounted to a leadframe tape. The die is mounted to a die pad of the leadframe coupled to the leadframe tape, and electrical connections are formed to couple the die to leads of the leadframe. The molding compound is then formed to encase the leadframe, the die, and the electrical connections to form a semiconductor package. This may be done on a large scale to produce thousands of semiconductor packages in single manufacturing batch.

The above formation technique is utilized to form several semiconductor packages in a single manufacturing batch. Unfortunately, when utilizing the above formation technique, molding compound may cover the leads and the die pad of the leadframe if debris gets under the leadframe tape when forming the molding compound. In other words, mold flashing may occur in the above process. Mold flashing is when molding compound covers all or portions of an exposed surface of a die pad and leads of a leadframe. This coverage reduces the effectiveness of semiconductor packages when utilized in an electronic device or makes semiconductor packages unusable or defective. Other difficulties exist as well. First, when applying solder balls to mount a semiconductor package within an electronic device, if solder balls are placed incorrectly, solder balls may touch multiple electrical connections and short circuit the semiconductor package in an electronic device. Second, to avoid solder ball defects or solder overlap between leads, die pads, and electrical connections or contacts within an electronic device, leads and die pads of a leadframe must be placed farther apart to reduce the chances of solder overflow and overlap.

BRIEF SUMMARY

The present disclosure provides semiconductor packages formed by utilizing a removable protective layer coupled to a leadframe. The leadframe includes die pad portions and lead portions. More specifically, a removable protective layer is coupled to one side of each die pad portion and one side of each lead portion of the leadframe, the removable protective layer coupled to the leadframe is then coupled to a leadframe tape. The removable protective layer protects the die pad and the leads of the leadframe from mold flashing and forms recesses corresponding to the lead portions and the die pad portions of the leadframe.

According to one embodiment, a package is formed having a leadframe, a die, and a molding compound. In this embodiment, the leadframe includes a plurality of die pad portions and a plurality of lead portions. The die pad portions and the lead portions have a first side and a second side. The first side and the second side of each die pad portion is substantially opposite from each other. Similarly, the first side and the second side of each lead portion is substantially opposite from each other. A die is coupled to the second side of each die pad portion by an adhesive material. Once the dice have been placed, a plurality of electrical connections is formed. The plurality of electrical connections may be formed by a plurality of wires. Each wire of the plurality of wires may have a first end coupled to a respective second side of each lead portion and a second end coupled to a respective die of the dice. A molding compound layer is formed overlying the leadframe tape to encase each die, the electrical connections, the protective layer, the die pad portions of the leadframe, and the lead portions of the leadframe. Once the molding compound layer has cured, the leadframe tape is removed exposing the protective layer coupled to the leadframe. The protective layer is then selectively removed forming recesses below each of the die pad portions of the leadframe and each of the lead portions of the leadframe. Once the protective layer has been selectively removed, the molding compound layer, the electrical connections, the lead portions of the leadframe, the die pad portions of the leadframe, and the die are singulated into individual semiconductor packages.

A singulated semiconductor package includes a die, a die pad, a plurality of leads, a plurality of wires and electrical connections, a molding compound, an extension portion of molding compound, and a plurality of recesses. The extension portion of the molding compound is integral with the molding compound and extends a length beyond a first side of the plurality of leads and a first side of the die pad. The plurality of recesses within the molding compound includes a plurality of first recesses. Each first recess of the plurality of first recesses exposes a respective first side of a respective lead of the plurality of leads to an external environment. Furthermore, the plurality of recesses includes a second recess that exposes the first side of the die pad to the external environment. Finally, each recess of the plurality of recesses has a respective depth equal to the length of the extension portion that extends beyond the first side of the lead portions and the first side of the die pad portions.

This semiconductor package has the additional benefit that if solder balls are attached to the plurality of leads and the die pad within the first recesses and the second recess, the leads of the plurality of leads and the die pad can be placed more closely. The leads and the die pad can be placed more closely because when the package is mounted within an electronic device using solder, the solder has a place to flow that is not toward the other leads and the die pad. There is also a barrier, such as a wall, between adjacent leads, to prevent the solder from flowing away from the lead it is first connected to. In turn, this reduces the chances of short circuiting in a package when being mounted within an electronic device and reduces the number defects in the solder when forming solder balls.

One goal is to provide a reliable semiconductor package that can be formed that reduces the number of defects in semiconductor packages when being manufactured on a large scale using a molding compound. This reduction in defects reduces manufacturing costs and increases the overall percentage of viable semiconductor packages from each manufacturing batch.

BRIEF DESCRIPTION OF THE SEVERAL VIEWS OF THE DRAWINGS

In the drawings, identical numbers identify similar elements or acts unless the context indicates otherwise. The sizes and relative positions of elements in the drawings are not necessarily drawn to scale.

FIG. 1 is a cross-sectional side view of a prior art formation technique for forming a prior art semiconductor package;

FIG. 2 is a cross-sectional side view of the prior art semiconductor formation technique in which mold flashing has occurred due to utilizing the prior art formation technique in FIG. 1;

FIGS. 5-12 are cross-sectional side views of successive steps of a method of forming a plurality of semiconductor packages with a view at the location shown in line 13-13 in FIG. 4A utilizing a removable backside protective layer according to the embodiments disclosed;

FIG. 13 is a cross-sectional side view along 13-13 in FIG. 4A of a completed semiconductor package formed by utilizing a removable backside protective layer;

DETAILED DESCRIPTION

Figure 3:
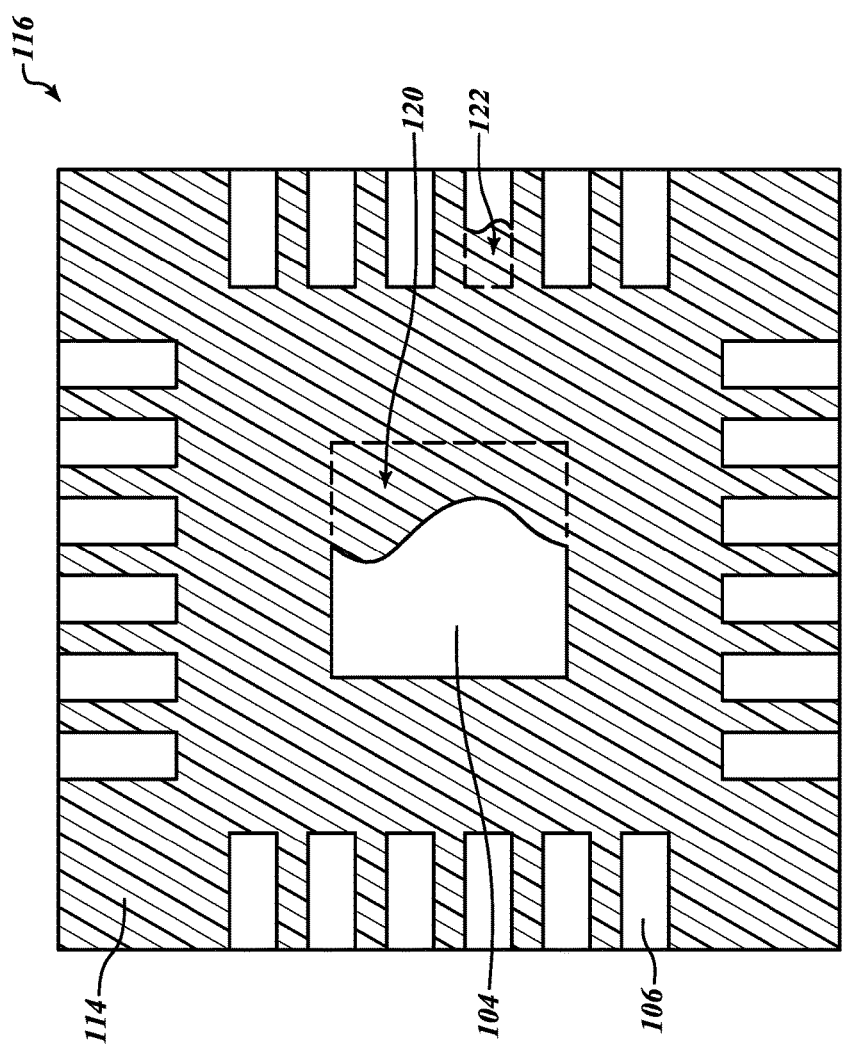
FIG. 3 is a bottom plan view of a prior art semiconductor package with mold flashing due to the prior art formation technique in FIGS. 1 and 2.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 shows a prior art formation technique of forming prior art semiconductor package array 100. The prior art semiconductor package array 100 is formed using a leadframe tape 102, a leadframe 104, 106, an adhesive material 108, a die 110, a plurality of wires 112, and a molding compound layer 114.

In this prior art semiconductor package array 100, no mold flashing has occurred. The prior art semiconductor package array 100 has a leadframe that includes die pad portions 104 and lead portions 106. The die pad portions 104 have a first side and a second side, and the lead portions 106 have a first side and a second side. The first side of the die pad portions 104 and the first side of the lead portions 106 are coupled to a leadframe tape 102. The die pad portions 104 and the lead portions 106 are spaced by an appropriate distance to avoid contact between the die pad portions 104 and the lead portions 106 throughout the formation process and later mounting of the prior art semiconductor package array 100 within an electronic device. After the die pad portions 104 and the lead portions 106 are coupled to the leadframe tape 102, a die 110 is coupled to each second side of the die pad portions 104 of the leadframe. Each die of the dice 110 is coupled to a respective second side of a respective die pad portion 104 by an adhesive material 108. Once the dice 110 have been placed, electrical connections are formed by placing a plurality of wires 112 that electrically connect the dice 110 and the lead portions 106 of the leadframe. Each wire 112 of the plurality of wires 112 having a respective first end coupled to a respective second side of a respective lead portion 106 and a respective second end coupled to a respective die of the plurality of die 110. After the plurality of wires 112 have been placed to form electrical connections between the lead portions 106 and the dice 110, a molding compound layer 114 is formed. The molding compound layer 114 overlies the leadframe tape 102. Furthermore, the molding compound layer 114 encapsulates the die pad portions 104, the lead portions 106, the adhesive material 108, the plurality of die 110, and the plurality of wires 112. After the molding compound layer 114 has cured and hardened, the leadframe tape 102 is removed. When the leadframe tape 102 is removed, the first side of the die pad portions 104 and the first side of the lead portions 106 are exposed. After the leadframe tape has been removed, the die pad portions 104, the lead portions 106, the adhesive material 108, the plurality of die 110, the plurality of wires 112, and the molding compound layer 114 combination are singulated into individual prior art semiconductor packages 116. Each singulated prior art semiconductor package 116 includes a die pad 104, a plurality of leads 106, an adhesive material 108, a die 110, a plurality of wires 112, and a molding compound 114.

This prior art semiconductor package array formation technique shows when the leadframe tape 102 remains perfectly flat. This allows for the die pad portions 104 and the lead portions 106 to remain flush with the leadframe tape and avoid mold flashing. However, if the leadframe tape does not remain flat due to debris or some other external stress or factor, the die pad portions 104 and the lead portions 106 may not remain flush with the leadframe tape 102, increasing the likelihood of mold flashing when forming the molding compound layer 114. In turn, increasing the number of defects and reducing the number of viable prior art semiconductor packages 116 produced from each manufacturing batch.

Another problem that may result when utilizing this prior art semiconductor package formation technique is solder overlap or overflow when mounting the individual prior art semiconductor package 116 within an electronic device. Solder overlap may occur because the contacts are flush with the bottom of the molding compound 114. The flush contacts may cause solder to overflow into areas not originally intended and cause multiple electrical contacts to be electrically connected when mounting the prior art semiconductor package 116 within the electronic device, even though the contacts were not intended to be electrically connected. This solder overlap and overflow may result in short circuiting of the prior art semiconductor packages 116 within the electronic device, or may result in other types of unwanted electrical connections and defects.

Additionally, because the die pad portions 104 and the lead portions 106 are coupled directly to the leadframe tape 102 through an adhesive that is on the leadframe tape 106, when the leadframe tape 102 is removed, the leadframe tape may leave an adhesive residue on the first side of the die pad portions 104 and on the first side of the lead portions 106. Similar to the mold flashing 120, 122, the leadframe tape 102 residue would cause the prior art semiconductor packages 116 to be less efficient because the residue would impede the flow of electricity when the prior art semiconductor package 116 is in use. However, instead of leaving the residue on the die pad 104 and the leads 106, the residue must be removed through another chemical wash step, but this increases the overall cost of manufacturing the prior art semiconductor packages 116 in large batches. Finally, when applying these chemicals, it is possible for the chemicals to get into unwanted portions of the prior art semiconductor package 116. This unwanted exposure may break the prior art semiconductor package 116, may result in a shorter life span of the prior art semiconductor package 116, or may result in other defects in the prior art semiconductor package 116.

FIG. 2 shows the same prior art formation technique of forming the prior art semiconductor package array 100 in FIG. 1. But unlike the prior art semiconductor package array 100 in FIG. 1 where no mold flashing occurred, mold flashing 120, 122 has occurred on one die pad portion of the die pad portions 104 and one lead portion of the lead portions 106 due to debris 118 while forming the prior art semiconductor package 116.

In this prior art semiconductor package formation of FIG. 2, mold flashing has occurred at locations 120, 122 on a first side of one die pad portion of the die pad portions 104 and a first side of one lead portion of the lead portions 106. In a properly formed prior art semiconductor package 116, the first side of the one die pad portion 104 is exposed to an external environment, and the first side of the one lead portion 106 is exposed to the external environment. Mold flashing is when a molding compound covers portions of a leadframe that were originally not intended to be covered but exposed to an external environment. These exposed portions of the leadframe are usually used for mounting a prior art semiconductor package 116 within an electronic device. The leadframe array 100 is placed inside a mold prior to molding. The leadframe tape 102 will sit on the mold, and frequently small bits of debris 118 and 122 are present inside the molds, between the mold itself and the tape 102. They might be left from a prior molding process. In this case, debris 118 is under a leadframe tape 102 while a molding compound layer 114 is injected into the mold to overlie the leadframe tape 102 and to encapsulate the die 110. The mold itself is not shown, since they are well known in the art. The debris 118 has caused mold flashing 120, 122 on the first side of one die pad portion of the die pad portions 104 and the first side of one lead portion of the lead portions 106. More specifically, the mold flashing 120, 122 has occurred because the debris 118 caused the leadframe tape 102 to bend upward at some locations, so that the tape 102 is not fully flat. In this state, the molding compound layer 114 was applied to the leadframe tape 102 and the various components on the leadframe tape 102. As a result, the one die pad portion of the die pad portions 104 did not lay flat, and the seal between the leadframe tape 102 and the one die pad portion 104 was partially broken. Additionally, as a result of the debris 118, one lead portion of the lead portions 106 did not lay flat, and the seal between the leadframe tape 102 and the one lead portion 106 was partially broken. These partial breaks of the seal between the leadframe tape 102 and the one die pad portion 104, and the leadframe tape 102 and the one lead portion 106, resulted in the molding compound layer 114 partially covering the first side of the one die pad portion 104 and the first side of the one lead portion 106. In turn, the shifting of the one die pad portion 104 and the one lead portion 106 due to the debris 118 under the leadframe tape 102, resulted in mold flashing 120, 122. In other words, the shift in angle of the die pad portion 146 and the lead portion 140 due to the debris 118 caused the mold flashing 120, 122 to occur. Although debris 118 caused the mold flashing 120, 122 in this scenario, other external factors such as vibrations, wind, pressure differences, leadframe and leadframe tape defects, or other external factors may cause mold flashing 120, 122 defects in these prior art semiconductor packages 100, 116.

The die 110 are, in some cases, less than 1 mm in width. The debris 118 that would cause this mold flashing to occur might be very small, less than 10 microns in height, in some cases. It is thus very hard to remove all this debris or to make sure the tape 102 is planar to dimensions within 1 micron.

This mold flashing 120, 122 reduces the effectiveness of the prior art semiconductor package 116. This mold flashing 120, 122 reduces effectiveness because when the prior art semiconductor package 116 is mounted within an electronic device for use, the first side of the die pad 104 and the first side of the one lead of the plurality of leads 106 will be partially covered, resulting in a less efficient prior art semiconductor package 116 because the flow of electricity will be impeded by the mold flashing 120, 122. Additionally, if the mold flashing 120, 122 were to cover the entirety of the first side of the die pad 104 or the first side of the one lead of the leads 106, the prior art semiconductor package 116 may be faulty and not be capable of being utilized. Although the mold flashing 120, 122 may be etched away from the prior art semiconductor package 116, this extra etching process would result in larger manufacturing costs and a greater manufacturing time for each prior art semiconductor package 116 manufacturing batch.

FIG. 3 is a bottom plan view of the second prior art semiconductor package 116 as described in FIG. 2 after singulation. FIG. 3 shows a molding compound 114 covering a portion of the die pad 104 and a portion of one lead of the plurality of leads 106. In other words, mold flashing 120, 122 has occurred during the formation process of the prior art semiconductor package 116.

This example illustrates the shortcomings of attempts today to form prior art semiconductor packages that utilize a leadframe and a leadframe tape to mass produce semiconductor packages in large manufacturing batches using the least amount of steps, in the least amount of time, and with the least amount of overhead costs.

The present disclosure describes a semiconductor package and formation steps that overcome many of the shortcomings of the prior art. The present disclosure describes various semiconductor packages being formed by utilizing a removable backside protective layer to avoid mold flashing, leadframe tape residue, or a combination of both on the electrical contacts of a semiconductor package such as an exposed die pad or exposed leads. A semiconductor package according to the present disclosure provides a plurality of recesses and a plurality of extension portions of molding compound formed by a removable backside protective layer. For example, a removable backside protective layer may be an organic polymer that is water soluble and is coupled to a side of a die pad and a side of each lead of a plurality of leads. In turn, any mold flashing or leadframe tape residue that is left behind during formation of a molding compound layer or removal of a leadframe tape will be attached to the backside protective layer instead of the die pad and the leads. Once a molding compound layer is formed and a leadframe tape is removed, the removable backside protective layer is exposed to water, causing it to deteriorate, and it is removed from the package. In turn, any mold flashing and leadframe tape residue that is left behind during the formation of a molding compound layer or removal of a leadframe tape, will be removed as the backside protective layer is removed. Thus, a removable backside protective layer protects various electrical contacts of a semiconductor package during the formation process. For example, if mold flashing or leadframe tape residue is left behind on a removable backside protective layer, removing the backside protective layer will remove the mold flashing and leadframe tape residue from the package.

In one embodiment, a semiconductor package includes a leadframe having a die pad and a plurality of leads, a die, a plurality of wires, and a molding compound. The molding compound has a plurality of recesses, the plurality of recesses have a plurality of first recesses exposing a side of each lead of the plurality of leads, and a second recess exposing a side of the die pad. The recesses of the plurality of recesses are formed between extension portions of molding compound formed by the removal of a removable backside protective layer.

Figure 4A:
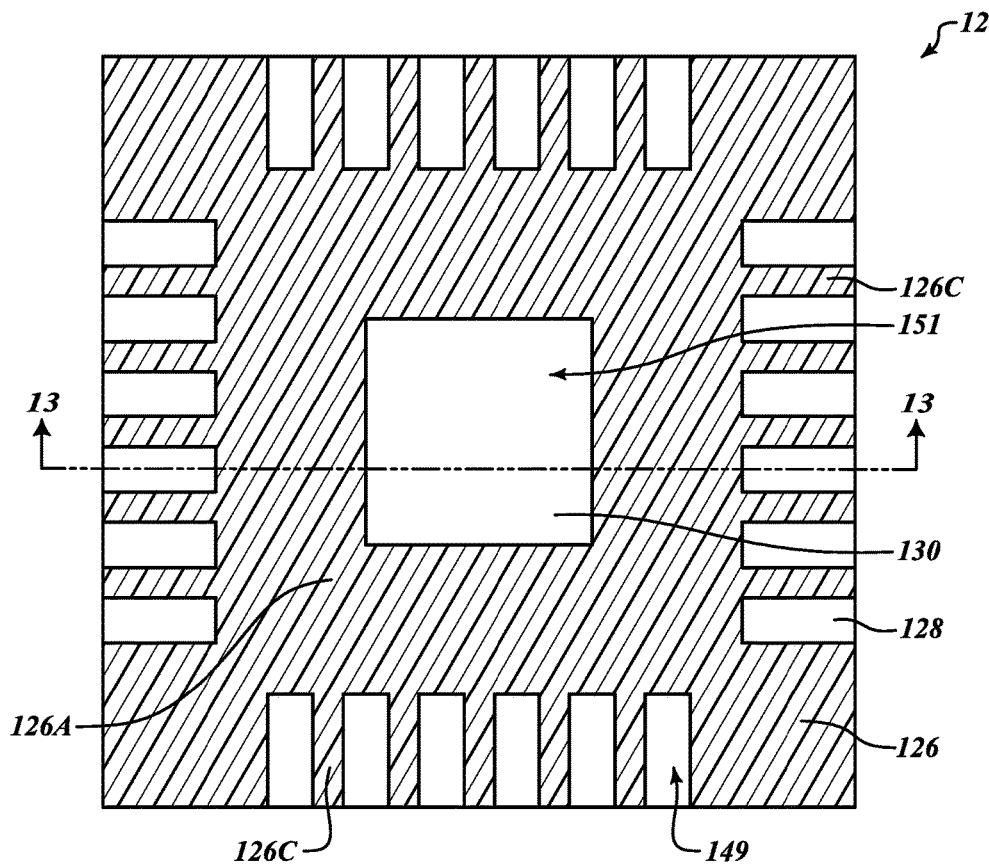
FIG. 4A is a bottom plan view of an embodiment of a completed semiconductor package formed using the disclosed removable backside protective layer.
Figure 4B:
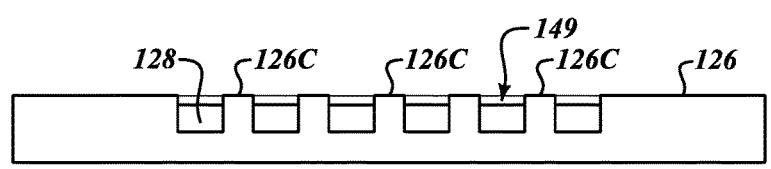
FIG. 4B is a side elevation view of the completed semiconductor package in FIG. 4A.

FIGS. 4A and 4B illustrate one embodiment of the present disclosure for providing a plurality of recesses 149, 151 and a plurality of extension portions 126A, 126C using a removable backside protective layer 132 of soluble material. This embodiment shows a semiconductor package 124 that has a plurality of extension portions 126A, 126C forming a plurality of recesses 149, 151 exposing a first side of a die pad 130 and a first side of each lead of a plurality of leads 128. This package 124 includes a molding compound 126, a plurality of extension portions 126A, 126C, a plurality of leads 128, and a die pad 130. The extensions 126A, 126C and the other portions of 126 act as walls to stop the flow of solder outside of the lead to which the solder is attached. These walls are a barrier that prevents the flow of solder beyond the boundary of the lead itself. In some embodiments, the walls 126A and 126C are made higher to provide a higher barrier to the solder flow.

FIGS. 5-12 illustrate the steps to form one embodiment of the semiconductor package 124. The leadframe 139 has two sides, a first side 141 and a second side 143. The leadframe 139 has a large number of die pads 140 and leads 146. The leadframe 139 has an array of die pads 140 to permit forming an array of packages in a single set of steps. FIG. 5 shows a cross-sectional side view of the leadframe 139 having lead portions 140 and die pad portions 146. The lead portions 140 have a first side 141 and a second side 143, and the die pad portions 146 have a first side 141 and a second side. The first side 141 of the lead portions 140 and the first side 141 of the die pad portions 146 are covered by a removable backside protective layer 132.

The preferred material for the removable backside protective layer 132 is an organic polymer that is water soluble of any type that is known in the semiconductor industry. One commercial source of this type of water soluble polymer is Kuraray Co., Ltd., which also uses its logo as Kuraray. Kuraray offers for sale in the market place today various types of acceptable water soluble polymers for the use as described herein. One such water soluble polymer sold by Kuraray is the ISOBAM series. The ISOBAM series is an alkali water soluble polymer that has excellent heat resistance and hardness. More specifically, ISOBAM is the trade name for a copolymer of isobutylene and maleic anhydride. The ISOBAM series comes in a variety of different formulations with different properties based on chemical composition of the polymer. These various adjustments in formulation allow for the ISOBAM series to be utilized in a multitude of different ways. The properties of these various ISOBAM water soluble polymers as sold by Kuraray, including the method of dissolving the ISOBAM, the preferred mixtures to dissolve the various types of ISOBAM, the physical properties of the ISOBAM, and other properties are described in data sheets provided by Kuraray to the public and therefore are not repeated herein.

Although a preferred material for the removable backside protective layer 132 may be an organic polymer that is water soluble, the backside protective layer may be any other material known to the semiconductor industry that may be removed through exposure to chemicals through a chemical soaking process or other materials that may be removed through an etching process.

In this embodiment, the removable backside protective layer 132 may be formed on the entire first side 141 of leadframe 139 through blanket deposition, spin-on deposition, or any other formation technique for applying a protective layer to a leadframe. This removable backside protective layer 132 will protect the first side of the leadframe 139 from leadframe tape residue, mold flashing, or a combination of both that can occur during the formation process of semiconductor packages, as explained herein. In addition, this removable backside protective layer 132 will form a plurality of recesses 149, 151 and a plurality of extension portions 126A, 126C in the molding compound 144 that will allow for solder balls to more easily be placed. In addition, the recesses 149, 151 and the extension portions 126A, 126C will reduce the likelihood of solder overlap and overflow between electrical contacts when a semiconductor package is mounted within an electronic device for use. This is because the lead portions 140 and the die pad portions 146 will have a first side that does not sit flush with an outside surface of a molding compound of a semiconductor package. Therefore, when the package is being mounted within an electronic device, the solder can flow to fill the entire recess's volume and is blocked from flowing towards other electrical contacts.

The leadframe 139 is of a standard type well known in the industry, and thus may have conductive bonding layer material such as a combination of Nickel, Palladium, Gold, or some other conductive metal or combination of conductive metals formed on the leads 140 and the die pad 146 to form stronger electrical contacts and connections. For example, a conductive metal may be deposited onto the first side of the lead portions 140 and the first side of the die pad portions 146 by electrode deposition, blanket deposition, or any other metal deposition technique. Once the metal is deposited, any excess conductive metal may be etched away. At which point, the removable backside protective layer 132 is formed on this layer of conductive metal. This will protect the conductive metal from mold flashing, leadframe tape residue, or a combination of both during the package formation process, as explained herein.

FIG. 6 shows a cross-sectional side view of a leadframe tape 134 connected to the removable backside protective layer 132. The leadframe tape 134 is attached to the backside protective layer 132 to help support the first side of the lead portions 140 and the first side of the die pad portions 146 during molding. In addition, the leadframe tape 134 will allow for a molding compound layer 144 to be applied later in the manufacturing process. The leadframe tape 134 may be any type of leadframe tape known to the semiconductor industry.

FIG. 7 shows a cross-sectional side view of a die 138 being coupled to the second side 143 of each die pad portion 146 of the leadframe. Each respective die of the plurality of die 138 is coupled to a respective second side of a respective die pad portion of the die pad portions 146. The dice 138 are coupled to the die pad portions 146 by an adhesive 136. The adhesive 136 may be a die attach film or some other adhesive material known to the semiconductor industry. More specifically, the adhesive 136 may be a conductive material electrically coupling the dice 138 to the die pad portions 146. However, the adhesive 136 may be a non-conductive material instead.

FIG. 8 shows a cross-sectional side view of a plurality of wires 142 electrically coupling the dice 138 to the lead portions 140 of the leadframe. Electrical connections are formed by placing the plurality of wires 142. In particular, each wire of the plurality of wires 142 has a first end coupled to a respective die of the dice 138 and a second end coupled to a respective lead portion of the lead portions 140. More specifically, the second end is coupled to a second side 143 of the lead portions 140. The wires 142 may be placed by a wire-bond attach process or wire bonding or some other technique.

In one embodiment, the electrical connections may be formed by some other electrical connection type than the plurality of wires 142. For example, if it is desired to have a thinner semiconductor package, then the die 138 might be connected by a flip chip technique in which the active surface of the die is face down and is in contact with the leads directly. In addition, in this embodiment a die pad 130 may or may not be utilized. For example, a leadframe may only have leads, but the leads may have support portions for the die 138. Additionally, in an embodiment that does have a die pad 130, the die pad 130 may not be electrically connected to the die 138, but the die pad 130 may be exposed to an external environment to reduce the thermal energy within a semiconductor package as it is being used. In other words, the die pad would act as a heat sink. Alternatively, the die pad 130 in alternative embodiments may be electrically coupled to a die 138.

FIG. 9 shows a cross-sectional side view of the leadframe 139 inside the mold and the molding compound layer 144 overlying the leadframe tape 134. The molding compound layer 144 encases and embeds the removable backside protective layer 132, the lead portions 140, the die pad portions 146, the adhesive 136, the dice 138, and the plurality of wires 142. The leadframe tape 134 will rest on a mold to support the leadframe 139 during molding. The molding compound may be a non-conductive epoxy material that is formed through compression molding, injection molding, or some other formation technique. The molding compound layer 144 may have any dimensions and shape as desired. The mold is not shown, since these are well known in the art.

Figure 10:
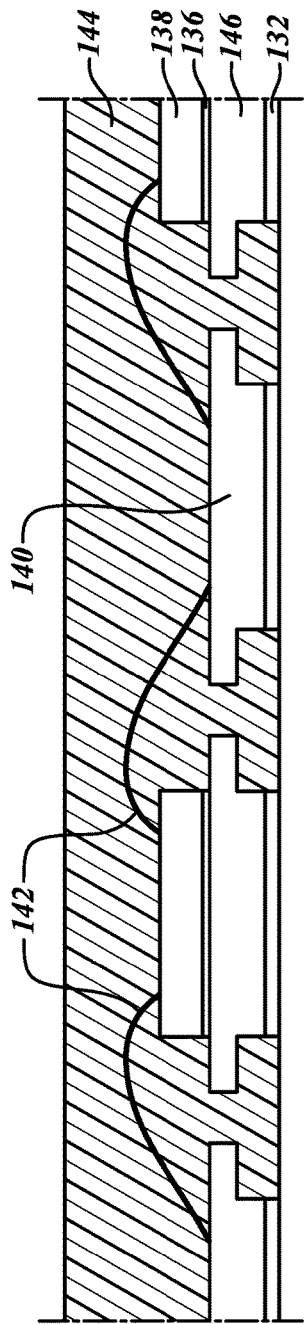

FIG. 10 shows a cross-sectional view of the array of the molded dice and leadframe after it has been removed from the mold. After the leadframe 139 is removed from the mold, it will be in the form of a large block having a plurality of die and leads molded in a single sheet. Upon removal from the mold, the leadframe tape 134 will still be present, attached to the backside protective layer 132. After the large block has been removed from the mold, the leadframe tape 134 is removed from the molding compound layer 144 and the removable backside protective layer 132. By removing the leadframe tape 134, the removable backside protective layer 132 is exposed to an external environment. The removable backside protective layer 132 is flush with an outer surface of the molding compound layer 144.

Figure 11:
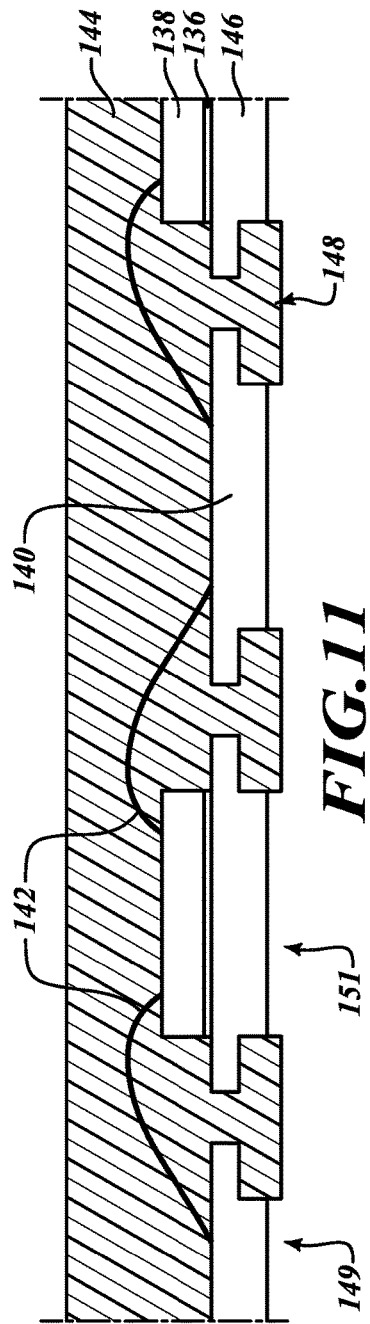

FIG. 11 shows a cross-sectional side view of the removable backside protective layer 132 having been removed from the lead portions 140 and the die pad portions 146 of the leadframe. The removal of the removable backside protective layer 132 from the lead portions 140 and the die pad portions 146 exposes the first sides of the lead portions 140 and the first sides the die pad portions 146 to an external environment. Because the removable backside protective layer 132 is preferred to be a water soluble material, the removable backside protective layer 132 may be removed by exposing or soaking the removable backside protective layer 132 in a water bath. Although the removable backside protective layer 132 is preferred to be a water soluble material, the removable backside protective layer 132 may also be chemically soluble. Therefore, a chemically soluble removable backside protective layer 132 may be removed by a chemical bath or a combination of a chemical bath and a water bath. Furthermore, if the removable backside protective layer 132 is a preferred organic polymer that is water soluble, then the speed of the removal of the water soluble removable backside protective layer 132 may be increased by applying the water to the removable backside protective layer 132 as a jet of water, or by increasing the pressure the water applied to the removable backside protective layer 132. By utilizing a water soluble removable backside protective layer 132, the manufacturing process can be made more efficient in both cost and time. It can be made more efficient in cost because using water to remove the removable backside protective layer 132 is lower in cost than purchasing chemicals to remove a chemically soluble removable backside protective layer 132. Similarly, by utilizing an organic polymer that is water soluble instead of chemically soluble material for the removable backside protective layer 132, the process can be made more environmentally friendly and safer for workers alike.

Once the removable backside protective layer 132 is removed, a plurality of extension portions 148 made of molding compound 144 that are integral with the molding compound 144 are formed. The extension portions 148 extend a distance equal to the thickness of the removable layer 132 beyond the first sides of each lead portion 140 and the first sides of each die pad portion 146. These extension portions 148 create a plurality of recesses 149, 151. Each recess of the plurality of recesses 149, 151 has a depth equal to the distance the extension portions 148 extend beyond the first surfaces of the lead portions 140 and the first surfaces of the die pad portions 146. The plurality of recesses includes a plurality of first recesses 149 and a plurality of second recesses 151. Each first recess of the plurality of first recesses 149 exposes a respective first side of a respective lead of the lead portions 140, and each second recess of the plurality of second recesses 151 exposes a respective first side of a respective die pad portion of the die pad portions 146. The depth of the recesses 149, 151 and the length of the extension portions 148 may be increased or decreased by increasing or decreasing the thickness that the removable backside protective layer 132 when it is attached to the first side of the lead portions 140 and the first side of the die pad portions 146. In other words, if the removable backside protective layer 132 is thicker, and thus extends a greater distance beyond the first side of the lead portions 140 and the first side of the die pad portions 146, then the length of the extension portions 148 will increase and, as a result, the depth of each recess of the plurality of recesses 149, 151 will increase as well. The opposite is true when the removable backside protective layer 132 is thinner, and extends a smaller distance from the first side of the lead portions 140 and the first side of the die pad portions 146 as well. The benefit of these recesses 149, 151 and extension portions 148 is that solder balls may be attached within these recesses 149, 151. This means that when the semiconductor package is going to be mounted within an electronic device, the solder has somewhere to flow, to fill the recess if needed. It is also blocked from the other electrical contacts of the semiconductor package. Thus, short circuiting of electrical contacts of a semiconductor package and unwanted electrical connections and contacts due to solder overlap will be greatly reduced.

FIG. 12 shows a cross-sectional side view of a singulation process of the array of dice mounted on the leadframe 139. The molding compound layer 144 is cut so that the lead portions 140, the die pad portions 146, the plurality of extension portions 148, the plurality of recesses 149, 151, the dice 138, and the plurality of wires 142 are singulated into semiconductor packages 124. See FIGS. 4A, 4B, and 13 for a singulated, completed semiconductor package 124. This array may be singulated into individual semiconductor packages 124 through saw singulation, laser etching, or some other technique for singulating semiconductor packages. The cutting device 150 may be a saw, a laser, or some other cutting device known in the semiconductor industry for package singulation.

FIG. 13 shows a cross-sectional side view of a singulated and completed semiconductor package 124 formed by the process in FIGS. 5-12 taken along 13-13 in FIG. 4A. The completed semiconductor package 124 includes a plurality of leads 128, a die pad 130 having die 138 coupled to it, extension portions 126A, 126C, a plurality of recesses 149, 151, a plurality of wires 142, and a molding compound 126. The die pad 130 has a first side 141 and a second side 143, and each lead of the plurality of leads 128 has a first side and a second side. The extension portions 126A, 126C are made of molding compound 126 that is integral with the molding compound 126. These extension portions 126A, 126C form a plurality of recesses 149, 151, the plurality of recesses includes a plurality of first recesses 149 and a second recess 151. Each recess 149 exposes a first side 141 of a respective lead, and the second recess 151 exposes a first side 141 of the die pad 130. A molding compound 126 encases the plurality of leads 128, the die pad 130, the adhesive 136, the die 138, and the plurality of wires into a singulated semiconductor package 124.

In addition, in this embodiment of a completed semiconductor package 124, a third side 145 of each lead of the plurality of leads 128 is exposed to an outside environment similar to the first side 141 of each lead of the plurality of leads 128. The third side is transverse to the second side and the first side of each lead of the plurality of leads 128. The third side 145 of each lead is flush with the outside surface of the molding compound 126 and is exposed to the external environment.

Figure 14:
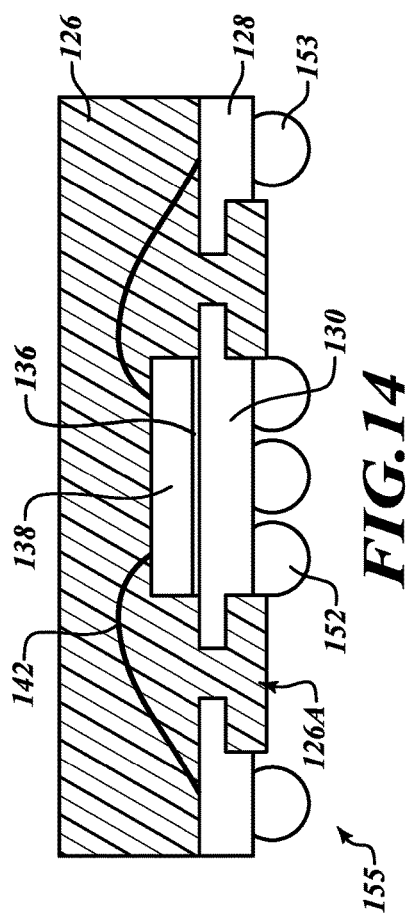
FIG. 14 is a cross-sectional side view of an alternative embodiment of a completed semiconductor package formed by utilizing a removable backside protective layer.

FIG. 14 shows a cross-sectional side view of the singulated and completed package of FIG. 13 having a plurality of solder balls 152 coupled to the plurality of leads 128 and the die pad 130 of the semiconductor package 124. The plurality of solder balls 155 includes a plurality of first solder balls 153 and a plurality of second solder balls 152. Each first solder ball 153 of the plurality of first solder balls is coupled within a respective first recess of the plurality of first recesses 149 to a respective lead of the plurality of leads 128, and the second solder balls 152 are coupled to the first side of the die pad 130 within the second recess 151. The plurality of solder balls 151 will be used to mount this completed semiconductor package within an electronic device such as a cellphone, a calculator, a tablet, a computer, or some other electronic device. These solder balls 155 may be attached before package singulation, after package singulation, by a user after the semiconductor packages have been purchased and shipped to another location, or at some other preferred time during the manufacturing and fabrication process of the end product.

Figure 15:
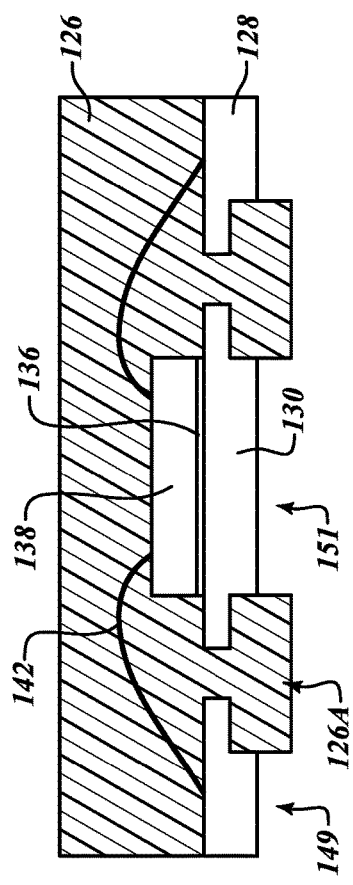
FIG. 15 is a cross-sectional side view of an alternative embodiment of a completed semiconductor package formed by utilizing a removable backside protective layer.

FIG. 15 is a cross-sectional side view of an alternative embodiment of a singulated and completed semiconductor package formed by the process in FIGS. 5-12. This alternative embodiment of a singulated and completed semiconductor package has extension portions 126A, 126C that are significantly longer than those in FIG. 13. These extension portions have a greater length because the removable backside protective layer 132, see FIG. 5, was thicker when it was applied to a first side of the die pad 130 and a first side of the leads of the plurality leads 128. Thus, once the removable backside protective layer 132 was removed from the semiconductor package, the extension portions 126A, 126C extend a greater distance beyond the first side of the die pad portions 146 and the first side of the lead portions 140 than those in FIG. 13.

The benefit of longer extension portions 126A, 126C is that they create deeper recesses 149, 151. These deeper recesses 149, 151 allow for electrical contacts such as the die pad 130 and the plurality of leads 128 to be placed closer together. They can be placed closer together because the solder has a larger volume to flow into when being mounted within an electronic device. In addition, the walls 126 between the leads are higher, creating a higher barrier to block the solder from flowing outside the lead area. In turn, the chance of solder overlap or overflow is reduced and, as a result, electrical contacts 128, 130 may be placed closer together within an alternative embodiment of a completed semiconductor package when the extension portions 126A, 126C are longer.

Figure 16:
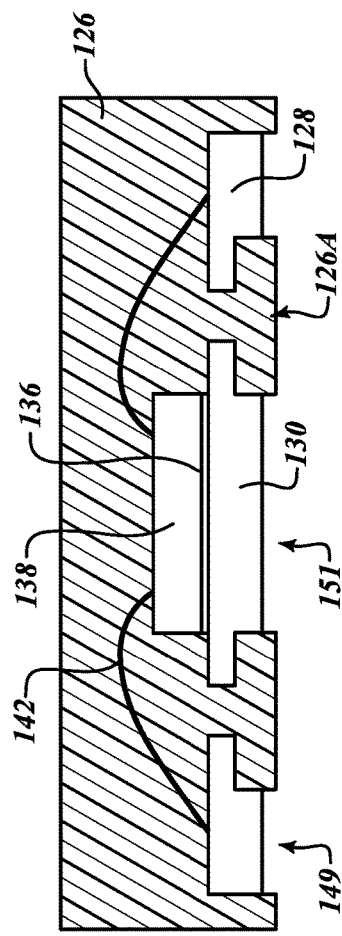
FIG. 16 is a cross-sectional side view of an alternative embodiment of a completed semiconductor package formed by utilizing a removable backside protective layer.

FIG. 16 is a cross-sectional side view of an alternative embodiment of a singulated and completed semiconductor package formed by the process of FIGS. 5-12. In this alternative embodiment, a completed semiconductor package has all of the components as the completed package in FIG. 13. However, a molding compound 126 extends past a third side 145 of each lead of the plurality of leads 128 and covers the third side 145 as well. Each lead of the plurality of leads has a first side 141 and a second side 143, the first side 141 is exposed to an external environment, and the second side 143 is coupled to the die by a wire of a plurality of wires 142 and is covered by molding compound 126. A third side 145 of each lead of the plurality of leads 128 is transverse to the first side 141 and the second side 143 of each lead of the plurality of leads 128. The molding compound 126 was formed in the formation process to cover the third side of the lead and extend a distance equal to that of the extension portions 126A, 126C extend beyond the first side of each lead of the plurality of leads 128 and the first side of the die pad 130. This defines the recesses 149, 151 more precisely and gives greater protection to the leads of the plurality of leads 128 than in FIG. 13. In addition, it gives the semiconductor package extra support and stability when being mounted within an electronic device.

Figure 17:
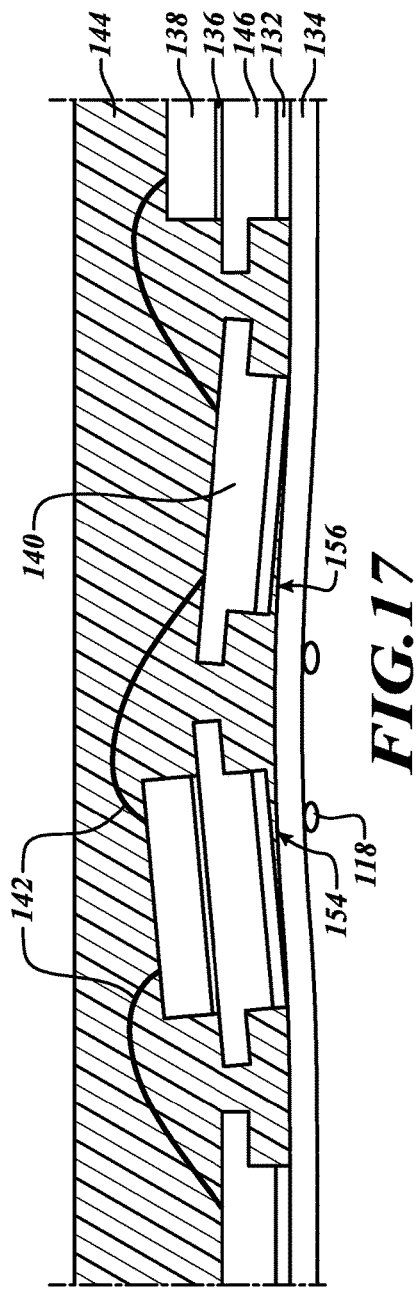
FIG. 17 is a cross-sectional side view of mold flashing when utilizing a removable backside protective layer to form semiconductor packages.

FIG. 17 is a cross-sectional side view of mold flashing 154, 156 caused by debris 118 during the fabrication process in FIGS. 5-12. Debris 118 can accumulate on the bottom mold frame during the formation process when the same mold is used over and over again, and the molding surface is not fully cleaned. Like FIG. 2 of the prior art, in which debris 118 caused mold flashing on one die pad portion of the die pad portions 104 and one lead portion of the lead portions 106, the same has occurred here. However, in this case, a removable backside protective layer 132 was applied to a first side of each die pad portion of the die pad portions 146 and a first side of each lead portion of the lead portions 140. The mold flashing 154, 156 that occurred is in contact with the removable backside protective layer 132 and not the die pad portions 146 or the lead portions 140. When the backside protective layer 132 is removed, the mold flashing 154, 156 is removed as well. The same goes for leadframe tape residue left behind when a leadframe tape is removed during the formation process. Thus, mold flashing 154, 156 occurred, but a viable package is still produced as a first side of the die pad portion 146 and a first side of the lead portion 140 will still be properly exposed to an external environment when the layer 132 is removed. This is the same result for leadframe tape residue left behind after removing the leadframe tape during the fabrication process.

Although mold flashing occurred due to debris 118 in this instance, mold flashing may result from other external factors such as vibration, wind, pressure, leadframe and leadframe tape defects, and many others.

Figure 18:
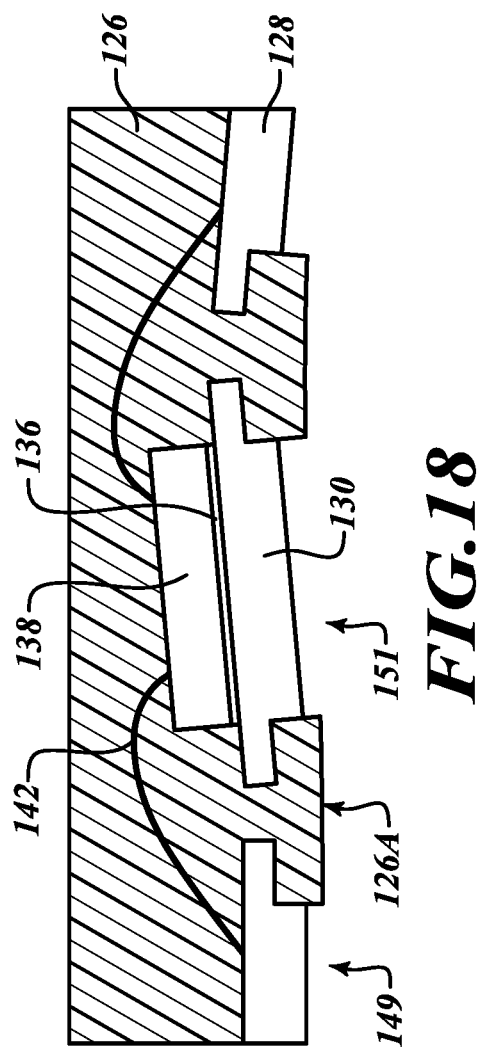
FIG. 18 is a cross-sectional side view of a completed semiconductor package even when mold flashing has occurred when utilizing a removable backside protective layer to form semiconductor packages.

FIG. 18 is the completed semiconductor package after the removable backside protective layer 132 was removed from FIG. 17, removing the mold flashing 154, 156 caused by the debris 118 or other external stresses and factors. As can be seen, the pad 130 and leads 128 are at a slight angle. (the amount of the angle has been enlarged and exaggerated to easily see it in the illustration; in practical application, it will not be as large. As can be seen in FIG. 18, the molding compound 126 would have some deformation due to the debris 118 under the leadframe tape 134 during formation of the semiconductor packages, however, the deformation would not stop the package from being capable of being utilized within an electronic device. Namely, the full bottom surface 141 of the leadframe is exposed and can accept the solder to provide a reliable and low resistivity connection.

Figure 19:
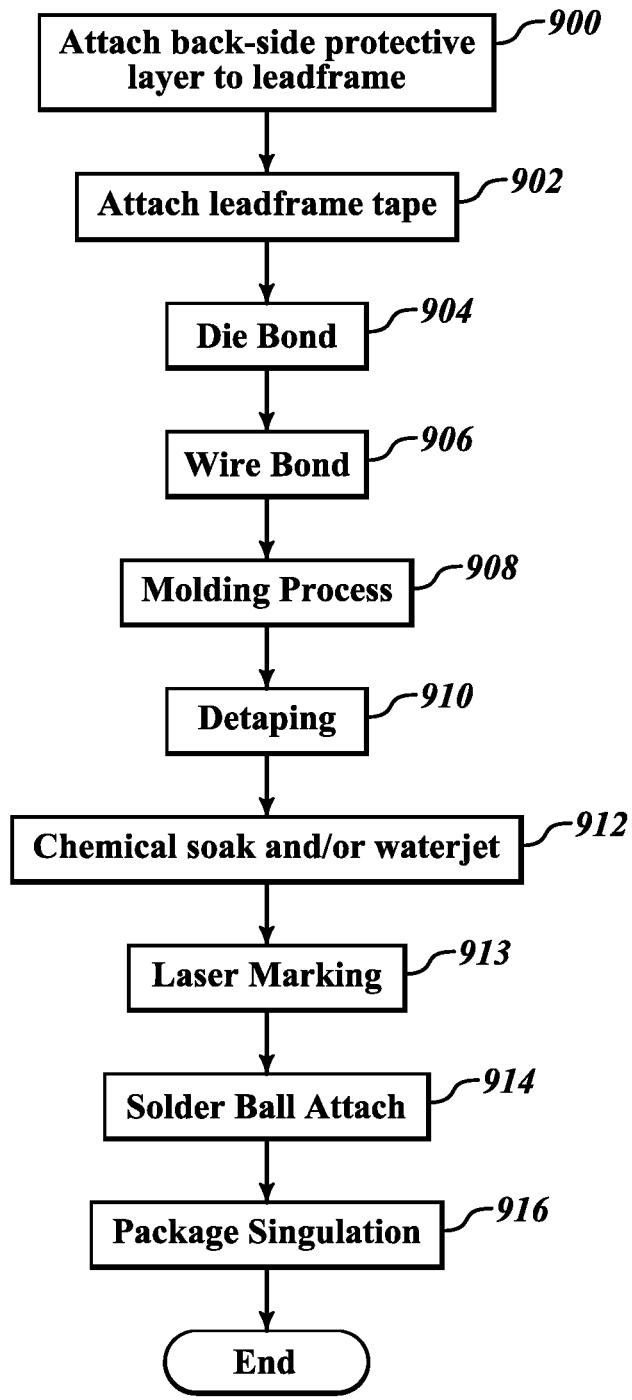
FIG. 19 is a flow chart diagram of successive steps of a semiconductor package formation technique utilizing a removable backside protective layer according to FIGS. 5-12.

FIG. 19 is a flow chart diagram of the process of successive steps of a package utilizing a removable backside protective layer 132 that is water soluble or chemically soluble according to FIGS. 5-12. More specifically, FIG. 19 shows a flow chart diagram summarizing a method of manufacturing hundreds, thousands, or any number of packages in a large array at one time using a removable backside protective layer 132 to reduce mold flashing defects, and form extension portions 126A, 126C and recesses 149, 151 to avoid mounting defects as well.

The first step 900 is to attach the removable backside protective layer 132 to the leadframe 139. This step 900 is shown in FIG. 5. In this step, the removable backside protective layer 132 is coupled to the leadframe 139 that includes an array of many die pads 146. The removable backside protective layer 132 may be coupled to the leadframe by a spin-on deposition, blanket deposition, physical attachment of tape, or some other formation or deposition technique for applying a layer of material to a leadframe.

Once the removable backside protective layer 132 is coupled to the lead portions 140 and the die pad portions 146 of the leadframe 139, the next step 902 is the attach leadframe tape 132. This step corresponds to FIG. 6. In this step, the removable backside protective layer 132 coupled to the leadframe is coupled to a leadframe tape 134. The leadframe tape 134 is coupled to the removable backside protective layer 132 by an adhesive on the leadframe tape 134.

After the leadframe and the removable backside protective layer 132 combination is coupled to the leadframe tape 134, the next step 904 is the die attach. This step corresponds to FIG. 7. In this step, each die of plurality of die 138 is coupled to each second side of the die pad portions 146 of the leadframe. The dice 138 are coupled to the second side of the die pad portions 146 by an adhesive material 136. The adhesive material 136 may be a die attach film that is conductive or non-conductive, or the adhesive material 136 may be some other adhesive such as glue.

Once the dice 138 are in place and coupled to the die pad portions 146 of the leadframe, the next step is the wire bond step 906. This step corresponds to FIG. 8. In this step, a plurality of wires 142 is placed to form electrical connections between the dice 138 and the lead portions 140 of the leadframe. Each wire of the plurality of wires 142 has a first end coupled to a respective second side of a respective lead portion of the lead portions 140 and a second end coupled to a respective die of the dice 138.

After the electrical connections are formed by wire bonding, the next step is the molding process 908 step. This step corresponds to FIG. 9. In this step, the leadframe 139 is placed in a mold, then the molding compound layer 144 is formed to overlie the leadframe tape 134. Furthermore, the molding compound layer 144 encases the removable backside protective layer 132, the lead portions 140, the die pad portions 146, the adhesive material 136, the dice 138, and the plurality of wires 142. Once the molding compound layer 144 is in place, the molding compound layer 144 is allowed to cure and harden. The molding compound layer 144 may be formed by compression molding, injection molding, or any other formation technique for forming molding compound or encapsulant known to the semiconductor industry.

Once the molding compound layer 144 has finished curing, the next step is the detaping step 910. This step corresponds to FIG. 10. In this step, the leadframe tape 134 is removed by a detaping process.

After the leadframe tape 134 has been removed, the next step is the chemical soak and/or waterjet 912 step. If the removable backside protective layer 132 is an organic polymer that is water soluble, then the removable backside protective layer 132 is exposed to a waterjet, which is a stream of high pressure water, to remove the removable backside protective layer 132. The removable backside protective layer 132 may instead be removed by soaking the removable backside protective layer 132 in water for a prolonged period of time to allow the water soluble removable backside protective layer 132 to deteriorate over time. On the other hand, if the backside protective layer is a chemically soluble material, then the removable backside protective layer 132 may be exposed to chemicals in a chemical bath to remove the removable backside protective layer 132. A combination of both chemical soak and waterjet may also be used depending on the composition of the removable backside protective layer 132. The chemical soak or the waterjet are selected that do not affect the molding compound 144 or the lead portions 140 or die pad portions 146 of the leadframe. If using a chemical soak instead of a water soak, some chemicals that could be used are Sulfuric Acid, Hydrofluoric Acid, or any other chemical that would deteriorate only the removable backside protective layer 132. In other words, the chemical soak, waterjet, or water bath only deteriorates and removes the removable backside protective layer 132 and leaves the rest of the components of the semiconductor package intact.

Additionally, if Sulfuric Acid is used to remove the removable backside protective layer 132 this will cause the metal of the leads and the die pad to become slightly rougher. In turn, this roughness would create a surface better suited for solderability. In addition, if a gold outer layer is on the leadframe 139, the Sulfuric Acid, in liquid form, would not degrade the metal contacts within the package.

Once the removable backside protective layer 132 has been removed from the lead portions 140 and the die pad portions 146 of the leadframe, the next step is laser marking step 913. The laser marking step step is optional. In the optional laser marking step 913, the packages are labeled by etching a mark into a molding compound 126 of a semiconductor package using a laser. This process may be done at a later time after package singulation or may be done by another after purchasing and shipment of completed semiconductor packages. Additionally, this laser mark step 913 may be done at any point as wanted or necessary during the semiconductor package formation process, or any time after the package formation process.

After the optional laser marking step 913, the next step is the solder ball attach step 914. This solder ball attach step is optional as well. A plurality of solder balls 152 may be attached to the exposed first sides of the die pad portions 146 and the exposed first sides of the lead portions 140. However, the solder balls may be attached at a later time such as after package singulation or by another after purchasing and shipping of the completed semiconductor packages to avoid defects in the solder balls during shipment. Additionally, this solder ball attach 914 step may be done at any point as wanted or necessary during the semiconductor package formation process.

After the optional solder ball attach step 914, the next step is the package singulation step 916. This step corresponds to FIG. 12. In this step, the packages are singulated into individual and completed semiconductor packages. This may be done through a laser etching process, a saw singulation process, or some other process for singulation of a large block of semiconductor components encased in a molding compound into individual and completed semiconductor packages.

By utilizing the method disclosed above, individual packages are manufactured in batches of hundreds, thousands, or any number as needed. Also, the number of viable individual and singulated packages may be increased due to utilizing a removable backside protective layer, the removable backside protective layer protecting leads and die pads of individual semiconductor packages from mold flashing or mounting defects. Thus, this removable backside protective layer reduces the number of mold flashing defects in packages and reduces the chances of mounting defects, and allows packages to be made with less waste due to defective packages, under safer conditions, and with fewer steps reducing overall overhead costs.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a semiconductor package, comprising:
   selectively coupling a protective layer to a first surfaces of die pad portions and a first surface of lead portions of a leadframe, the die pad portions and the lead portions each having second surfaces opposite the first surfaces;
   coupling a leadframe tape to the protective layer;
   coupling a die to each second surface of the die pad portions;
   forming a plurality of electrical connections, each electrical connection having a first end coupled to a second surface of a respective lead portion and a second end coupled to a respective die;
   forming a molding compound layer, the molding compound layer overlying the leadframe tape, the protective layers, the second surface of the die pad portions, the second surface of the lead portions, the die, and the electrical connections;
   removing the leadframe tape to expose the protective layer;
   removing the protective layer to expose the first surface of the die pad portions and the first surface of the lead portions to an external environment, the removal of the protective layer forming a plurality of first recesses and a plurality of second recesses, each first recess exposing a respective first surface of the lead portions to the external environment, each second recess exposing a respective first surface of the die pad portions to the external environment; and singulating the molding compound layer, the die pad portions, the lead portions, the electrical connections, and the die into individual semiconductor packages.

2. The method of forming the semiconductor package of claim 1, wherein the protective layer is a water soluble material.

3. The method of forming the semiconductor package of claim 2, wherein removing the protective layer to expose the first surface of the die pad portions and the first surface the lead portions to the external environment includes exposing the protective layer to water.

4. The method of forming the semiconductor package of claim 3, wherein exposing the protective layer to water includes water jetting the protective layer.

5. The method of forming the semiconductor package of claim 1, wherein removing the protective layer to expose the first surface of the die pad portions and the first surface of the lead portions to an external environment includes soaking the protective layer in chemicals.

6. The method of forming the semiconductor package of claim 1, wherein removing the protective layer to expose the first surface of the die pad portions and the first surface of the lead portions includes a combination of exposing the protective layer in chemicals and exposing the protective layer to water.

7. The method of forming the semiconductor package of claim 1, wherein coupling a die to each second surface of the die pad portions includes using an adhesive material to couple each die to a respective second surface of the die pad portions.

8. The method of forming the semiconductor package of claim 1, wherein forming the electrical connections includes a plurality of wires, each wire of the plurality of wires having a respective first end coupled to a respective lead of the plurality of leads and a second end coupled to a respective die.

9. A method of forming a semiconductor package, comprising:
selectively coupling a protective layer to first surfaces of die pad portions and first surfaces of lead portions of a leadframe, the die pad portions and the lead portions having second surfaces opposite the first surfaces;
coupling a leadframe tape to the protective layer;
coupling a die to each second surface of the die pad portions;
forming a plurality of electrical connections, each electrical connection having a first end coupled to a respective second surface of a respective lead portion and a second end coupled to a respective die;
forming a molding compound, the molding compound overlying the leadframe tape, the protective layers, the second surface of the die pad portions, the second surface of the lead portions, the die, and the electrical connections;
removing the leadframe tape to expose the protective layer;
removing the protective layer to expose the first surfaces of the die pad portions and the first surfaces of the lead portions to an external environment, the removal of the protective layer forming a plurality of extension portions of the molding compound, each extension portion extends beyond the first surfaces of the lead portions and the first surfaces of the die pad portions, the plurality of extension portions abutting the lead portions and the die pad portions; and
singulating the molding compound, the die pad portions, the lead portions, the electrical connections, and the die into individual semiconductor packages.

10. The method of forming the semiconductor package of claim 9, wherein the protective layer is a water soluble material.

11. The method of forming the semiconductor package of claim 10, wherein removing the protective layer includes exposing the protective layer to water.

12. The method of forming the semiconductor package of claim 11, wherein exposing the protective layer to water includes utilizing a water jet.

13. The method of forming the semiconductor package of claim 9, wherein the protective layer is a chemically soluble material.

14. The method of forming the semiconductor package of claim 13, wherein removing the protective layer includes exposing the protective layer to a chemical.

15. The method of forming the semiconductor package of claim 9, wherein removing the protective layer includes exposing the protective layer to a water jet and a chemical bath.

16. The method of forming the semiconductor package of claim 9, wherein removing the protective layer to expose the first surface of the die pad portions and the first surfaces of the lead portions forms a plurality of first recesses and a plurality of second recesses, each first recess aligned with a respective lead portion, each second recess aligned with a respective die pad portion.

* * * * *